(12) United States Patent
Yang

(10) Patent No.: US 11,172,588 B1
(45) Date of Patent: Nov. 9, 2021

(54) SERVER DEVICE

(71) Applicants: Inventec (Pudong) Technology Corporation, Shanghai (CN); INVENTEC CORPORATION, Taipei (TW)

(72) Inventor: Chi-Chun Yang, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 17/107,969

(22) Filed: Dec. 1, 2020

(30) Foreign Application Priority Data

Sep. 4, 2020 (CN) .......................... 202010919484.5

(51) Int. Cl.
*G06F 1/16* (2006.01)
*H05K 5/00* (2006.01)
*H05K 7/00* (2006.01)
*H05K 7/14* (2006.01)
*H05K 5/02* (2006.01)

(52) U.S. Cl.
CPC .......... *H05K 7/1424* (2013.01); *H05K 5/0221* (2013.01); *H05K 5/0295* (2013.01); *H05K 7/1427* (2013.01)

(58) Field of Classification Search
CPC .. H05K 7/1424; H05K 7/1427; H05K 7/1425; H05K 7/1432; H05K 7/1428; H05K 5/0221; H05K 5/0295; H05K 5/0286; H05K 5/0256; H05K 5/0217
See application file for complete search history.

(56) References Cited

U.S. PATENT DOCUMENTS

| 7,214,088 | B1* | 5/2007 | Liang | G06F 1/188 361/679.55 |
| 7,414,852 | B1* | 8/2008 | Otte | H05K 7/1424 312/223.1 |
| 9,398,720 | B1* | 7/2016 | Frank | H05K 7/1424 |
| 10,321,586 | B1* | 6/2019 | Fricker | H05K 7/1418 |
| 2002/0089056 | A1* | 7/2002 | Eady | H05K 7/1424 257/712 |
| 2004/0001320 | A1* | 1/2004 | Baar | H05K 7/1424 361/727 |
| 2005/0162836 | A1* | 7/2005 | Briggs | H05K 5/0021 361/724 |

(Continued)

*Primary Examiner* — Anthony M Haughton
(74) *Attorney, Agent, or Firm* — CKC & Partners Co., LLC

(57) ABSTRACT

A server device includes a chassis, some power cages, a spring leaf structure and a power supplying unit. The power cages are arranged inside the chassis. Two of the power cages define a space therebetween. The power cage includes a first plate having a first and a second holes. The spring leaf structure includes a main body, a blocking plate and an unlocking plate. The main body connects to the first plate. The blocking plate and the unlocking plate protrude to the space respectively through the first and the second holes. The blocking plate includes a straight edge. The unlocking plate includes a curved edge. The power supplying unit includes a main and a subsidiary plates. The subsidiary plate and the main plate form a stair structure. The subsidiary plate is configured to abut against the straight edge or the curved edge.

6 Claims, 9 Drawing Sheets

(56) References Cited

U.S. PATENT DOCUMENTS

| | | | |
|---|---|---|---|
| 2006/0056137 A1* | 3/2006 | Mueller | H05K 7/1425 361/600 |
| 2007/0147010 A1* | 6/2007 | Arnel | H05K 7/1424 361/727 |
| 2008/0003854 A1* | 1/2008 | Pyle | H05K 7/20572 439/188 |
| 2013/0147327 A1* | 6/2013 | Muhr | H05K 9/0016 312/223.2 |
| 2017/0265323 A1* | 9/2017 | Blume | H05K 7/1407 |

* cited by examiner

SERVER DEVICE

RELATED APPLICATIONS

This application claims priority to Chinese Application Serial Number 202010919484.5 filed Sep. 4, 2020, which is herein incorporated by reference.

BACKGROUND

Technical Field

The present disclosure relates to server devices.

Description of Related Art

With the increase of living qualities of people, the demand of people for computer equipment has also been increasing. Correspondingly, in order to fulfill the increasing demand of the consumers, the manufacturers have been working hard to improve the computer equipment.

Apart from improving the operational efficiency of computer equipment, for example, the method to facilitate the replacement of power supply of computer equipment while avoiding damage due to inappropriate installation is undoubtedly an important issue which the industry highly concerns.

SUMMARY

A technical aspect of the present disclosure is to provide a server device, which can prevent the power supplying unit from being inserted into the accommodation space in the up-side-down status, such that the power supplying unit and the power distributing unit are effectively prevented from being damaged due to incorrect installation.

According to an embodiment of the present disclosure, a server device includes a chassis, a plurality of power cages, a spring leaf structure and at least one power supplying unit. The power cages are arranged along a first direction inside the chassis. The power cages are separated from each other. Each of the power cages extends along a second direction. Adjacent two of the power cages define an accommodation space therebetween. At least one of the power cages includes a first plate body. The first plate body has a first surface and a second surface. The first surface and the second surface are opposite to each other. The first surface defines the accommodation space. The first plate body has a first through hole and a second through hole. The first through hole and the second through hole are arranged along a third direction. The first direction, the second direction and the third direction are perpendicular to each other. The spring leaf structure includes a main body, a blocking plate and an unlocking plate. The main body extends along the second direction. An end of the main body is connected with the second surface. The blocking plate and the unlocking plate are respectively connected with another end of the main body. The blocking plate and the unlocking plate protrude to the accommodation space respectively through the first through hole and the second through hole. The blocking plate includes a straight edge extending along the first direction. The unlocking plate includes a curved edge. The power supplying unit includes a second plate body. The second plate body is configured to abut against and slide along the first surface. The second plate body includes a main plate and a subsidiary plate. The main plate and the subsidiary plate are connected with each other. The subsidiary plate and the main plate form a stair structure. The subsidiary plate is configured to abut against the straight edge or the curved edge. When the subsidiary plate abuts against the straight edge, the blocking plate blocks the power supplying unit from further inserting into the accommodation space. When the subsidiary plate abuts against the curved edge, the unlocking plate is pressed to leave from the accommodation space, such that the main body elastically deforms and the blocking plate also leaves from the accommodation space.

In one or more embodiments of the present disclosure, the main body is at least partially located between the blocking plate and the unlocking plate.

In one or more embodiments of the present disclosure, the blocking plate and the unlocking plate are substantially parallel with each other and are substantially perpendicular to the main body.

In one or more embodiments of the present disclosure, the main plate includes a first edge and a second edge. The first edge and the second edge are opposite to each other. The subsidiary plate includes a third edge and a fourth edge. The third edge and the fourth edge are opposite to each other. The first edge and the third edge are mutually connected to form a straight line. The second edge and the first edge have a first distance therebetween. The fourth edge and the third edge have a second distance therebetween. The second distance is less than the first distance.

In one or more embodiments of the present disclosure, the server device further includes a power distributing unit. The power distributing unit is disposed inside the chassis. The power supplying unit is configured to electrically connect with the power distributing unit.

In one or more embodiments of the present disclosure, a quantity of the power supplying unit is plural. Each of the power supplying units is configured to accommodate in the corresponding accommodation space.

When compared with the prior art, the above-mentioned embodiments of the present disclosure have at least the following advantages:

(1) When the subsidiary plate of the second plate body abuts against the curved edge of the unlocking plate, the unlocking plate is pressed to leave from the accommodation space, such that the main body of the spring leaf structure elastically deforms and the blocking plate also leaves from the accommodation space. In this way, the blocking plate is no longer protruding to the accommodation space, and the power supplying unit is able to continue to insert into and accommodate in the accommodation space. In other words, the blocking plate guarantees that the power supplying unit is inserted into the accommodation space in a correct direction of installation.

(2) If the power supplying unit is inserted into the accommodation space in the up-side-down status, the subsidiary plate of the power supplying unit abuts against the blocking plate. When the subsidiary plate of the power supplying unit abuts against the straight edge of the blocking plate, the blocking plate blocks the power supplying unit from further inserting into the accommodation space. In this way, the power supplying unit is not able to continue to be inserted into the accommodation space anymore. In other words, under the action of the spring leaf structure, the server device provides a foolproof mechanism to prevent the power supplying unit from being inserted into the accommodation space in the up-side-down status (i.e., incorrect status). As a result, the power supplying unit and the power distributing unit are effectively prevented from being damaged due to incorrect installation.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
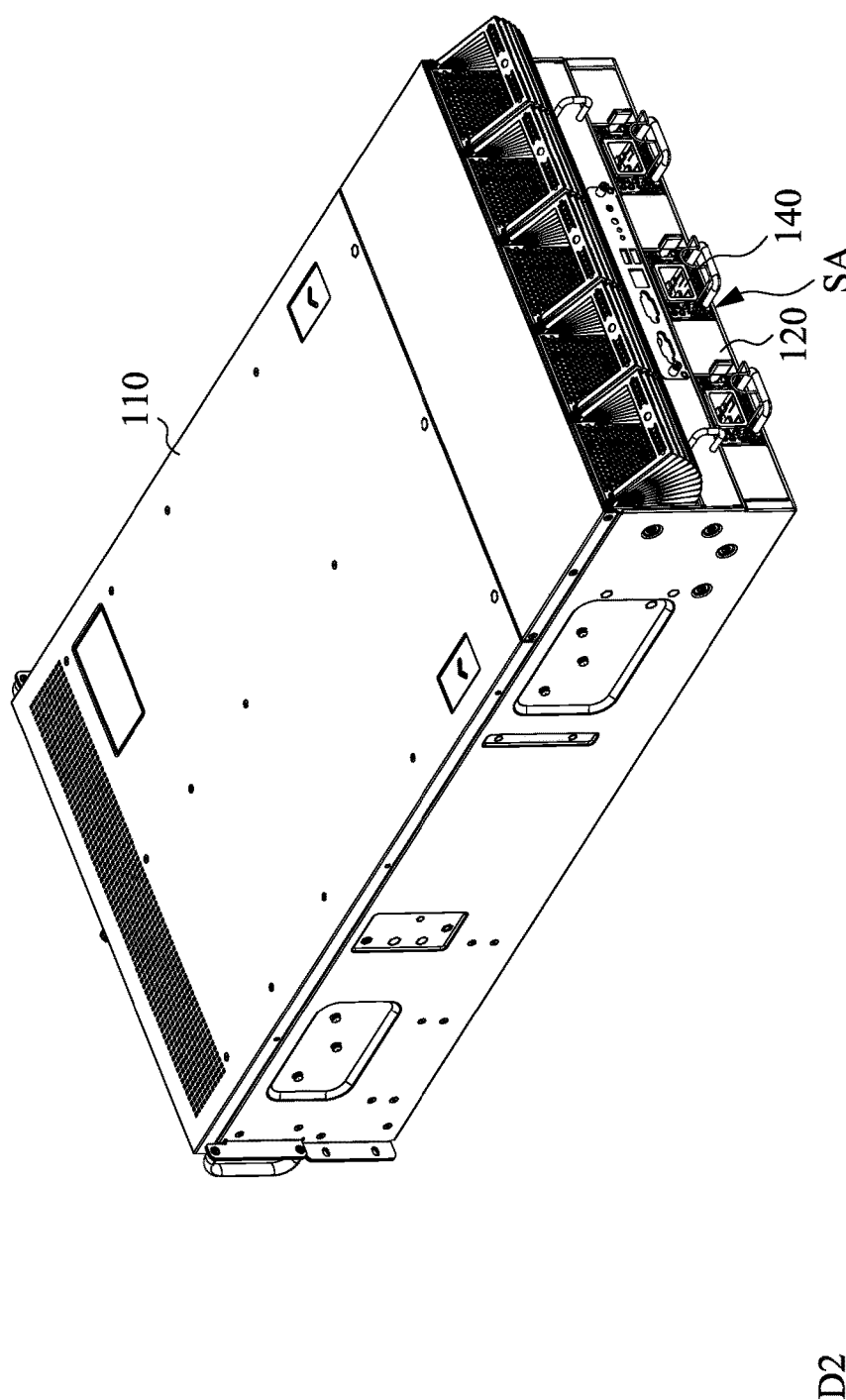
FIG. 1 is a schematic view of a server device according to an embodiment of the present disclosure.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
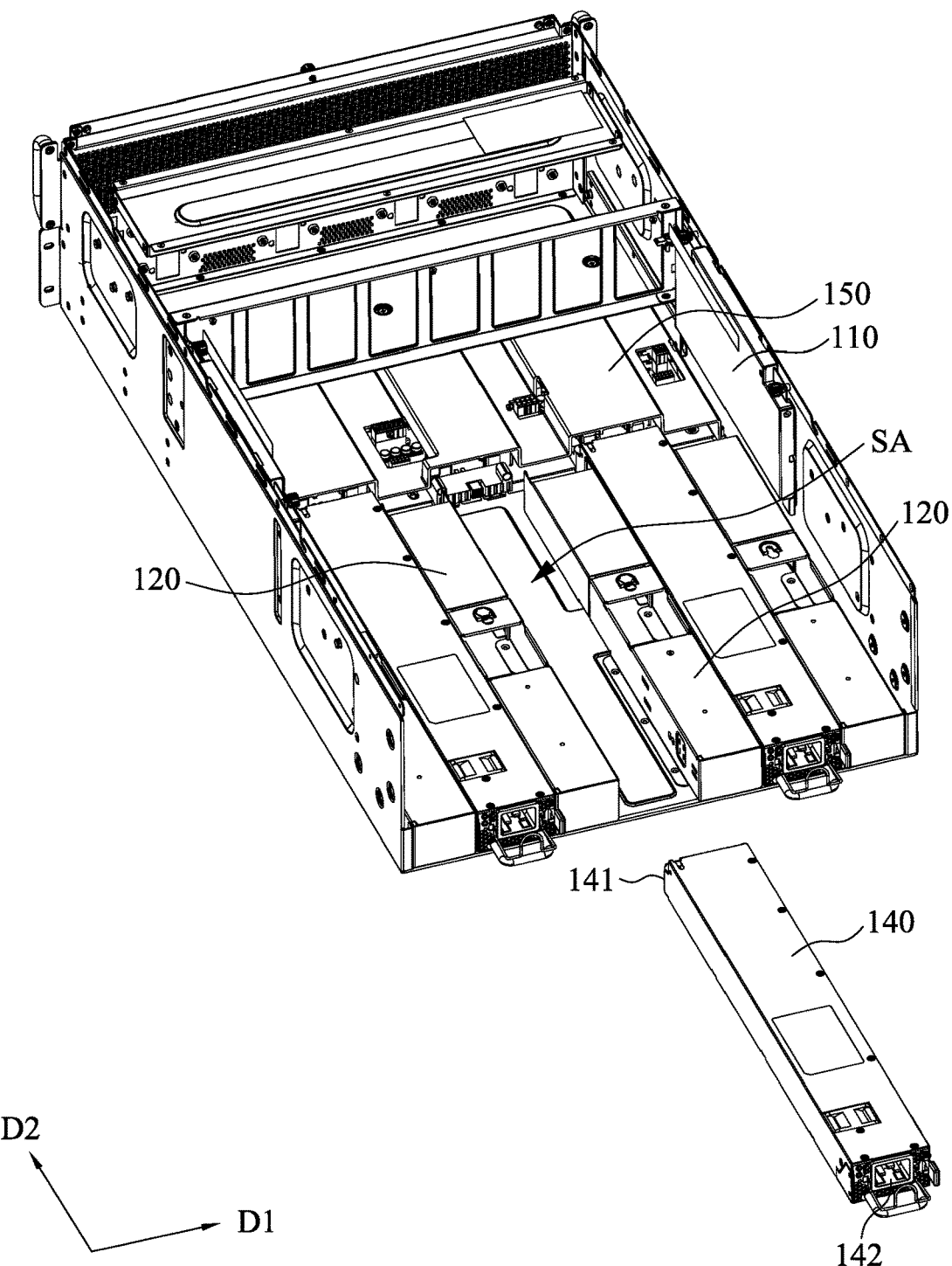
FIG. 2 is a partially exploded view of the server device of FIG. 1.

Reference is made to FIGS. 1-2. FIG. 1 is a schematic view of a server device 100 according to an embodiment of the present disclosure. FIG. 2 is a partially exploded view of the server device 100 of FIG. 1. In this embodiment, as shown in FIGS. 1-2, a server device 100 includes a chassis 100, a plurality of power cages 120 and at least one power supplying unit 140. The power cages 120 are arranged along a first direction D1 inside the chassis 110. The power cages 120 are separated from each other. Adjacent two of the power cages 120 define an accommodation space SA therebetween. The accommodation space SA is configured to accommodate the power supplying unit 140.

Figure 3:
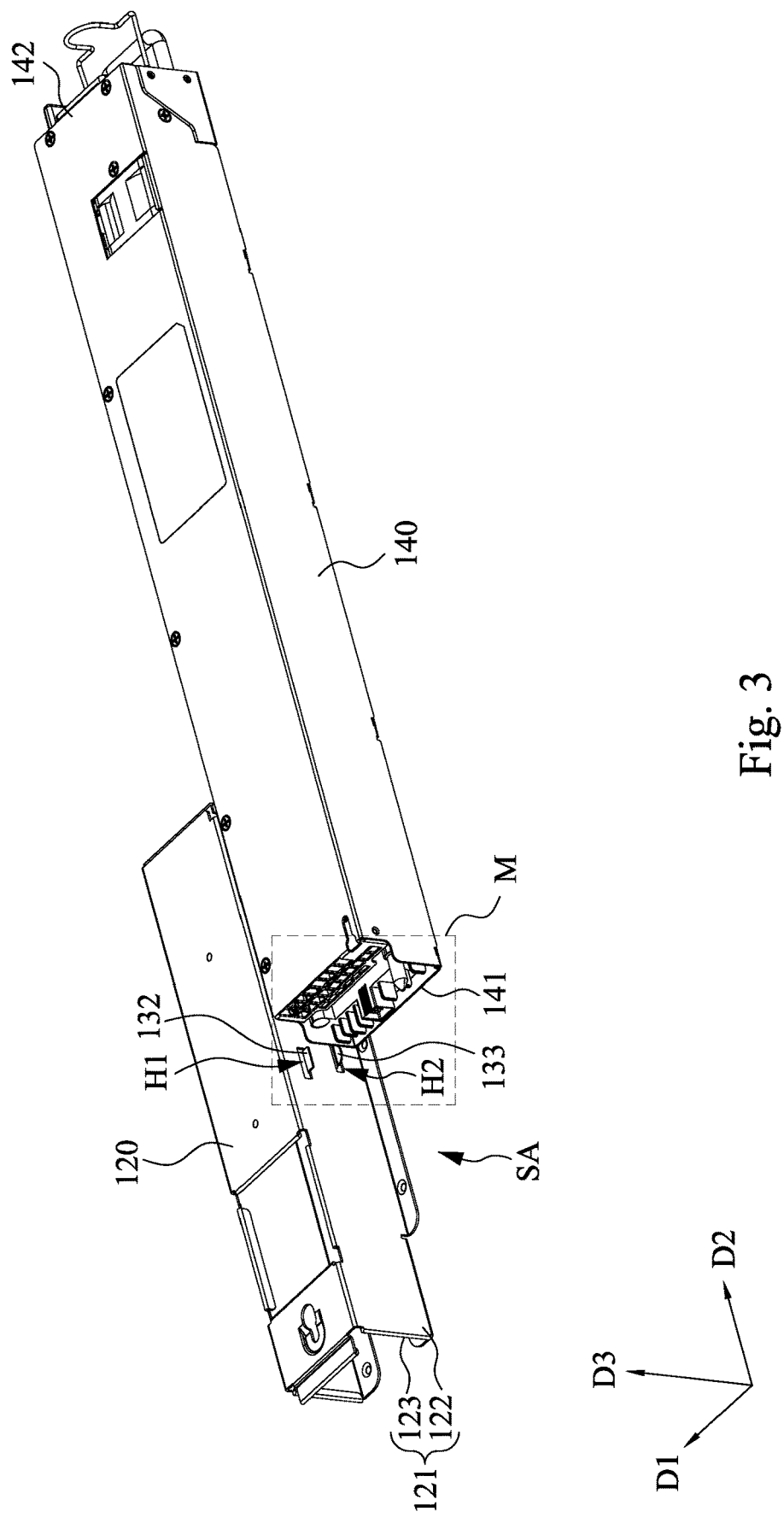
FIG. 3 is a view showing a relative position of the power supplying unit and the power cage of FIG. 2, in which the power supplying unit abuts against the unlocking plate.
Figure 4:
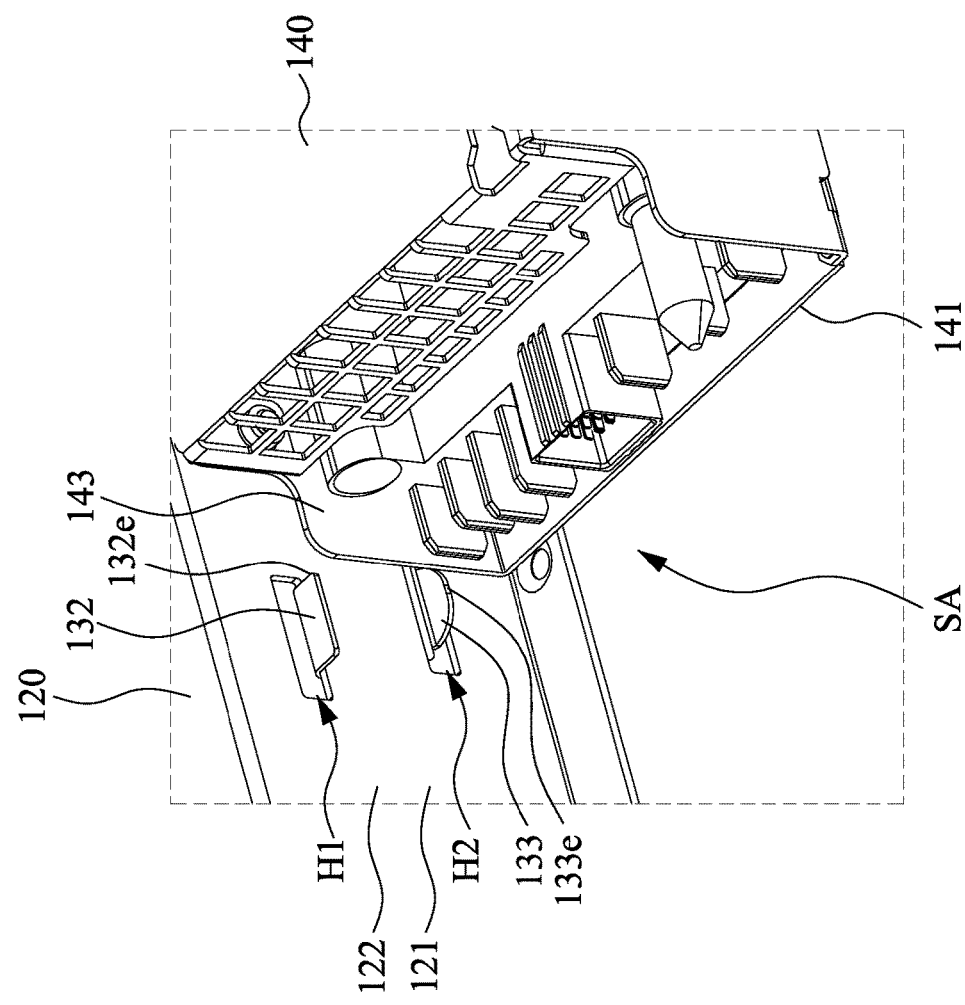
FIG. 4 is a partially enlarged view of the area M of FIG. 3.

Please refer to FIGS. 3-4. FIG. 3 is a view showing a relative position of the power supplying unit 140 and the power cage 120 of FIG. 2, in which the power supplying unit 140 abuts against the unlocking plate 133. FIG. 4 is a partially enlarged view of the area M of FIG. 3. For the simplification of the figures, only the power supplying unit 140 and the power cage 120 are shown in FIGS. 3-4, while other structures of the server device 100 are omitted. In this embodiment, as shown in FIGS. 3-4, at least one of the power cages 120 includes a first plate body 121. The first plate body 121 includes a first surface 122 and a second surface 123. The first surface 122 and the second surface 123 are opposite to each other. The first surface 122 defines the accommodation space SA (please also refer to FIG. 2). The first plate body 121 has a first through hole H1 and a second through hole H2. The first through hole H1 and the second through hole H2 are arranged along a third direction D3. The first direction D1, the second direction D2 and the third direction D3 are perpendicular to each other.

Figure 5:
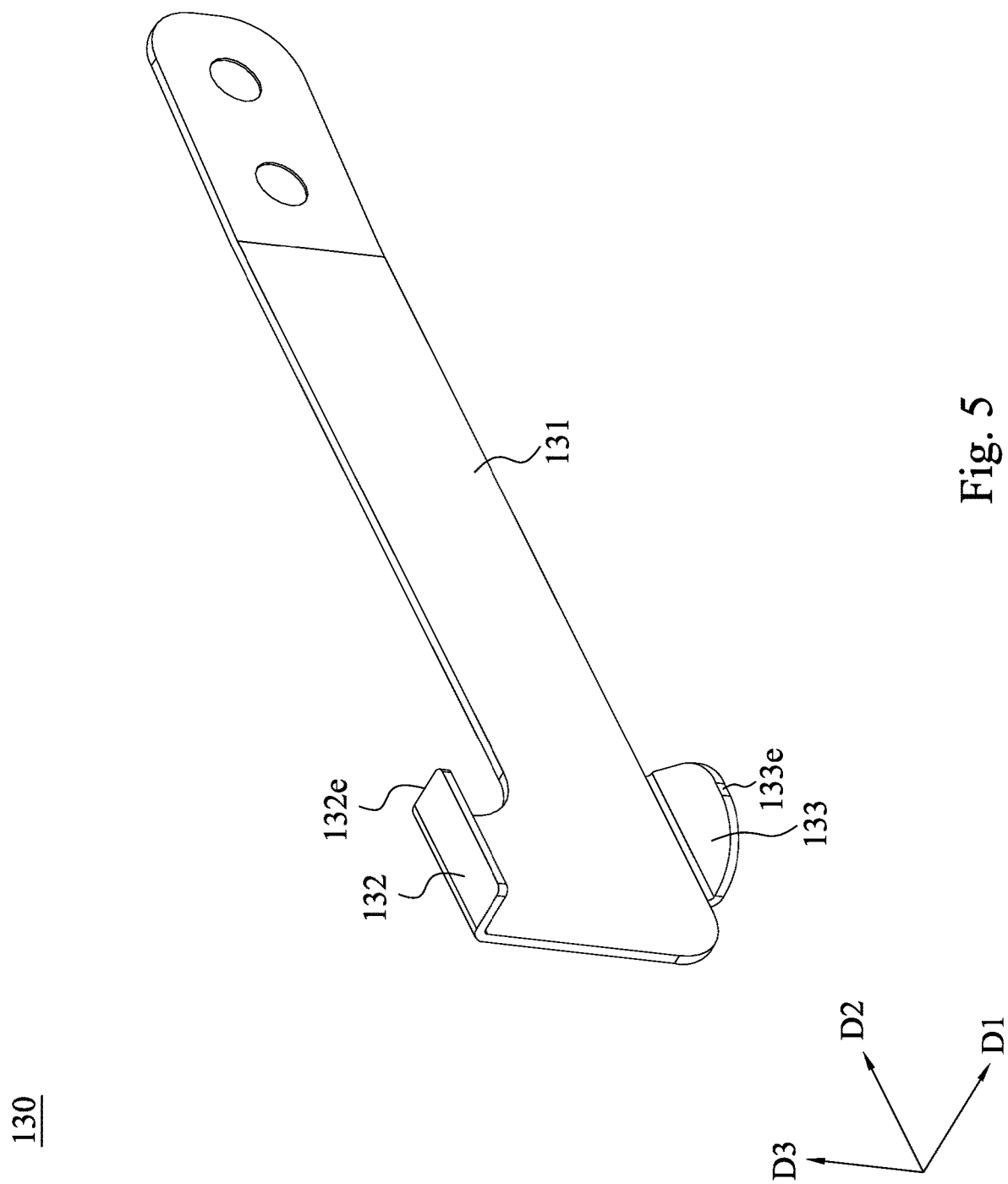
FIG. 5 is a schematic view of the spring leaf structure of FIG. 3.
Figure 6:
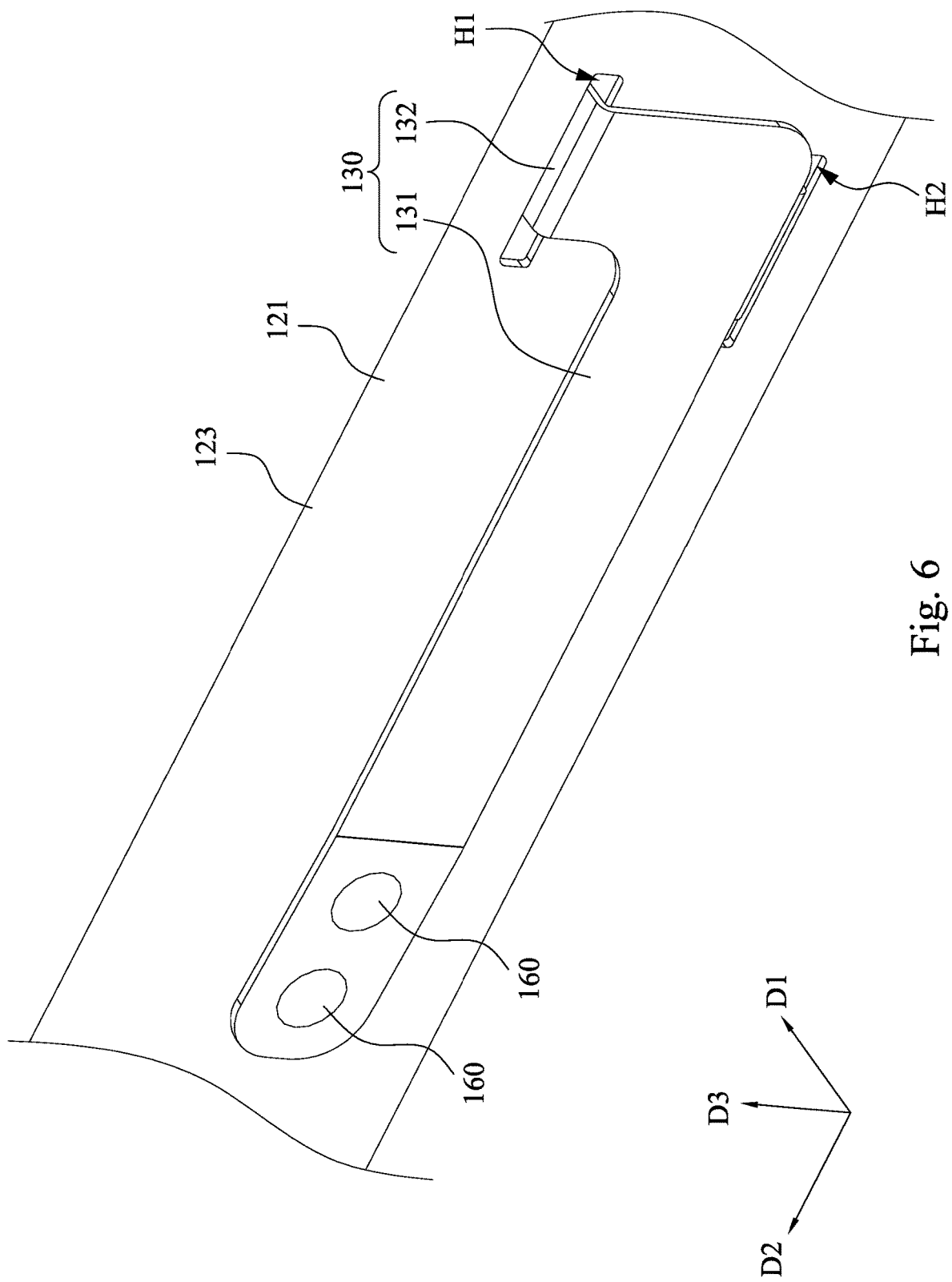
FIG. 6 is a schematic view of the spring leaf structure of FIG. 3, in which the spring leaf structure is connected with the first plate body.

Please refer to FIGS. 5-6. FIG. 5 is a schematic view of the spring leaf structure 130 of FIG. 3. FIG. 6 is a schematic view of the spring leaf structure 130 of FIG. 3, in which the spring leaf structure 130 is connected with the first plate body 121. In this embodiment, as shown in FIGS. 3-6, the server device 100 includes a spring leaf structure 130. The spring leaf structure 130 includes a main body 131, a blocking plate 132 and an unlocking plate 133. The main body 131 extends along the second direction D2. An end of the main body 131 is connected with the second surface 123 of the first plate body 121. For example, the main body 131 is connected and fixed on the first plate body 121 through a rivet 160. However, this does not intend to limit the present disclosure. Relatively, the blocking plate 132 and the unlocking plate 133 are respectively connected with another end of the main body 131.

In this embodiment, as shown in FIG. 4, the blocking plate 132 and the unlocking plate 133 of the spring leaf structure 130 protrude to the accommodation space SA respectively through the first through hole H1 and the second through hole H2 of the first plate body 121. It is worth to note that, as shown in FIG. 5, the blocking plate 132 of the spring leaf structure 130 includes a straight edge 132e. The straight edge 132e extends along the first direction D1. On the other hand, the unlocking plate 133 of the spring leaf structure 130 includes a curved edge 133e.

In addition, as shown in FIG. 5, the main body 131 of the spring leaf structure 130 is at least partially located between the blocking plate 132 and the unlocking plate 133. To be more specific, the blocking plate 132 and the unlocking plate 133 of the spring leaf structure 130 are substantially parallel with each other. Moreover, the blocking plate 132 and the unlocking plate 133 are substantially perpendicular to the main body 131.

In this embodiment, as shown in FIGS. 2-3, the power supplying unit 140 includes a first end 141 and a second end 142. The first end 141 and the second end 142 are opposite to each other. The first end 141 of the power supplying unit 140 is configured to insert into the accommodation space SA along the second direction D2. As shown in FIG. 2, the server device 100 further includes a power distributing unit 150. The power distributing unit 150 is disposed inside the chassis 110. The first end 141 of the power supplying unit 140 is configured to electrically connect with the power distributing unit 150. In practical applications, as shown in FIG. 2, a quantity of the power supplying unit 140 is plural.

Each of the power supplying units 140 is configured to accommodate in the corresponding accommodation space SA.

Figure 7:
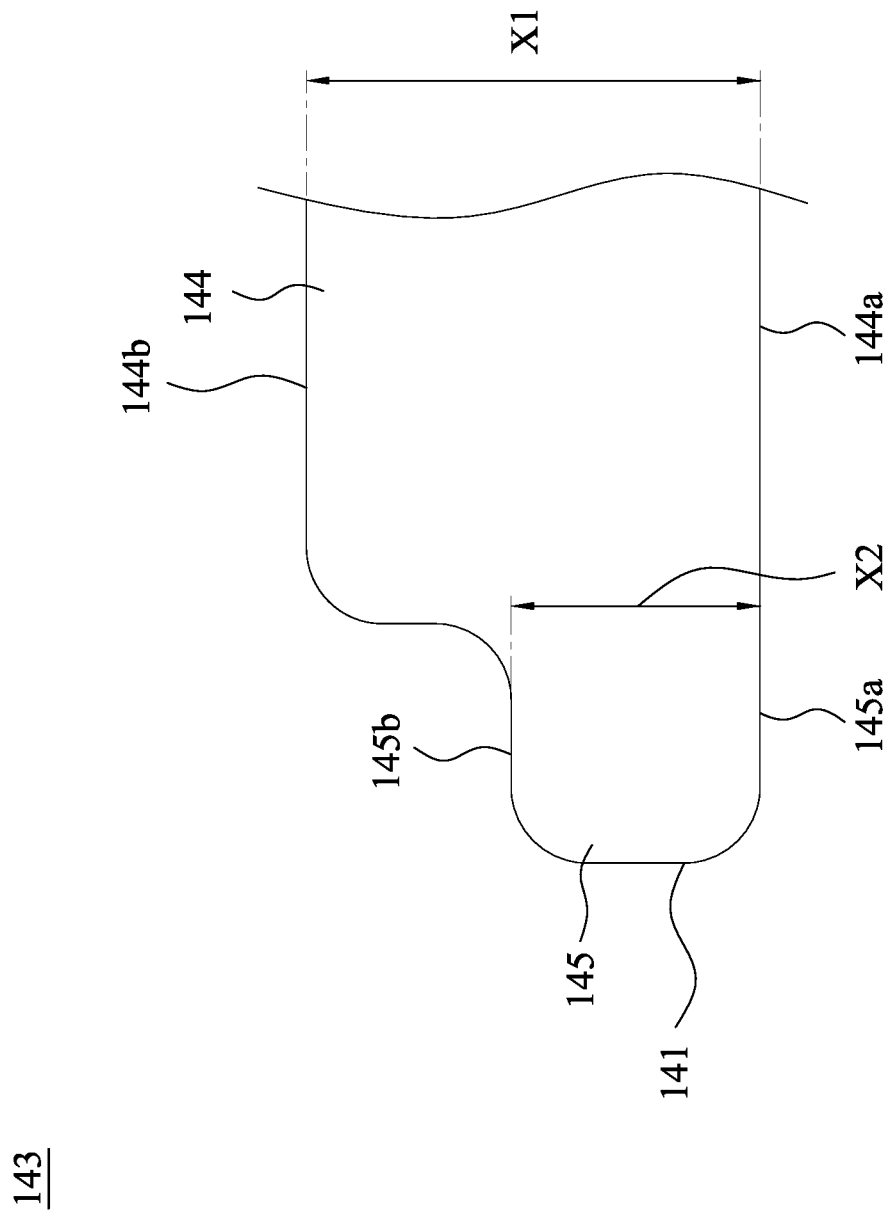
FIG. 7 is a partially enlarged view of the second plate body of FIG. 4.

In addition, as shown in FIG. 4, the power supplying unit 140 includes a second plate body 143. The second plate body 143 is configured to abut against and slide along the first surface 122 of the of the first plate body 121. Please refer to FIG. 7. FIG. 7 is a partially enlarged view of the second plate body 143 of FIG. 4. In this embodiment, as shown in FIG. 7, the second plate body 143 of the power supplying unit 140 includes a main plate 144 and a subsidiary plate 145. The main plate 144 and the subsidiary plate 145 are connected with each other. The subsidiary plate 145 is closer to the first end 141 then the main plate 144 to the first end 141. The subsidiary plate 145 and the main plate 144 form a stair structure. The subsidiary plate 145 is configured to abut against the straight edge 132e of the blocking plate 132 or the curved edge 133e of the unlocking plate 133 (please refer to FIGS. 4-5 for the straight edge 132e and the curved edge 133e).

In practical applications, as shown in FIG. 4, when the subsidiary plate 145 of the second plate body 143 abuts against the curved edge 133e of the unlocking plate 133, the unlocking plate 133 is pressed to leave from the accommodation space SA, such that the main body 131 of the spring leaf structure 130 elastically deforms and the blocking plate 132 also leaves from the accommodation space SA. In this way, the blocking plate 132 is no longer protruding to the accommodation space SA, and the power supplying unit 140 is able to continue to insert into and accommodate in the accommodation space SA. In other words, the blocking plate 132 guarantees that the power supplying unit 140 is inserted into the accommodation space SA in a correct direction of installation.

In the structural point of view, as shown in FIG. 7, the main plate 144 of the second plate body 143 includes a first edge 144a and a second edge 144b opposite to each other. The subsidiary plate 145 includes a third edge 145a and a fourth edge 145b opposite to each other. The first edge 144a of the main plate 144 and the third edge 145a of the subsidiary plate 145 mutually connect to form a straight line. The second edge 144b and the first edge 144a of the main plate 144 have a first distance X1 therebetween. The fourth edge 145b and the third edge 145a of the subsidiary plate 145 have a second distance X2 therebetween. The second distance X2 is less than the first distance X1.

Figure 8:
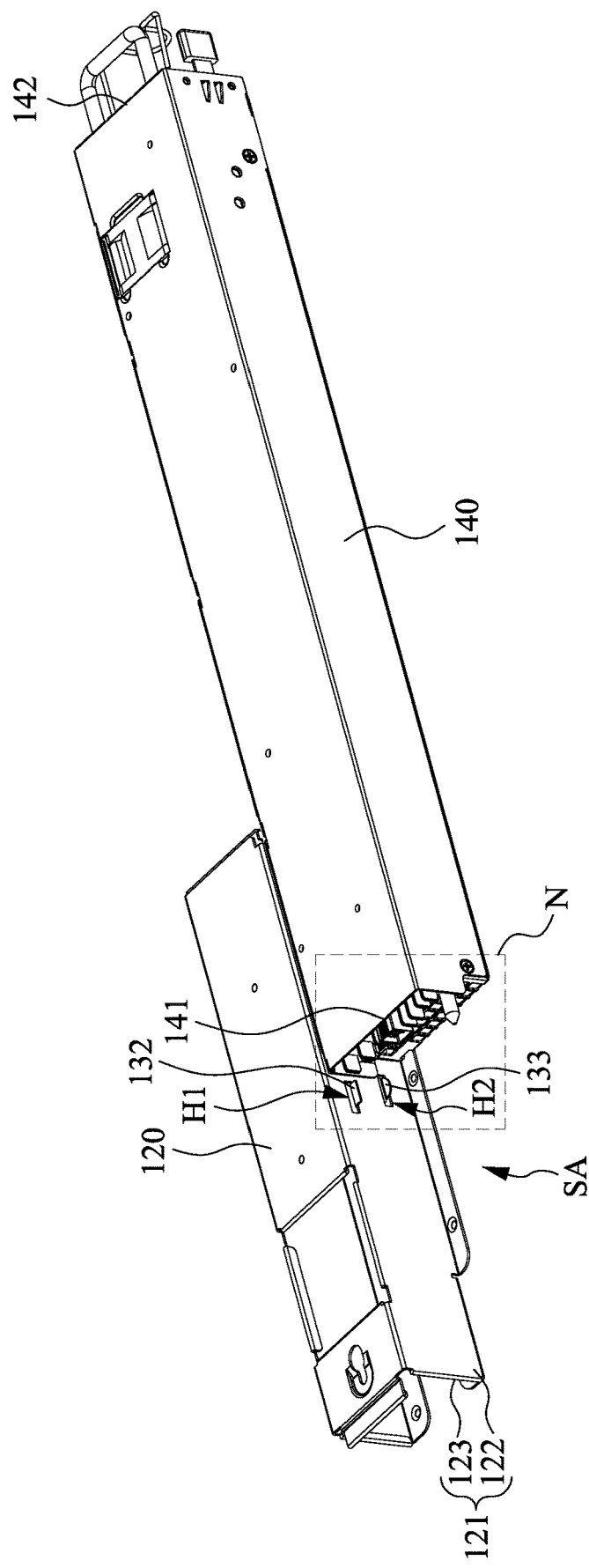
FIG. 8 is a view showing a relative position of the power supplying unit and the power cage of FIG. 2, in which the power supplying unit abuts against the blocking plate.
Figure 9:
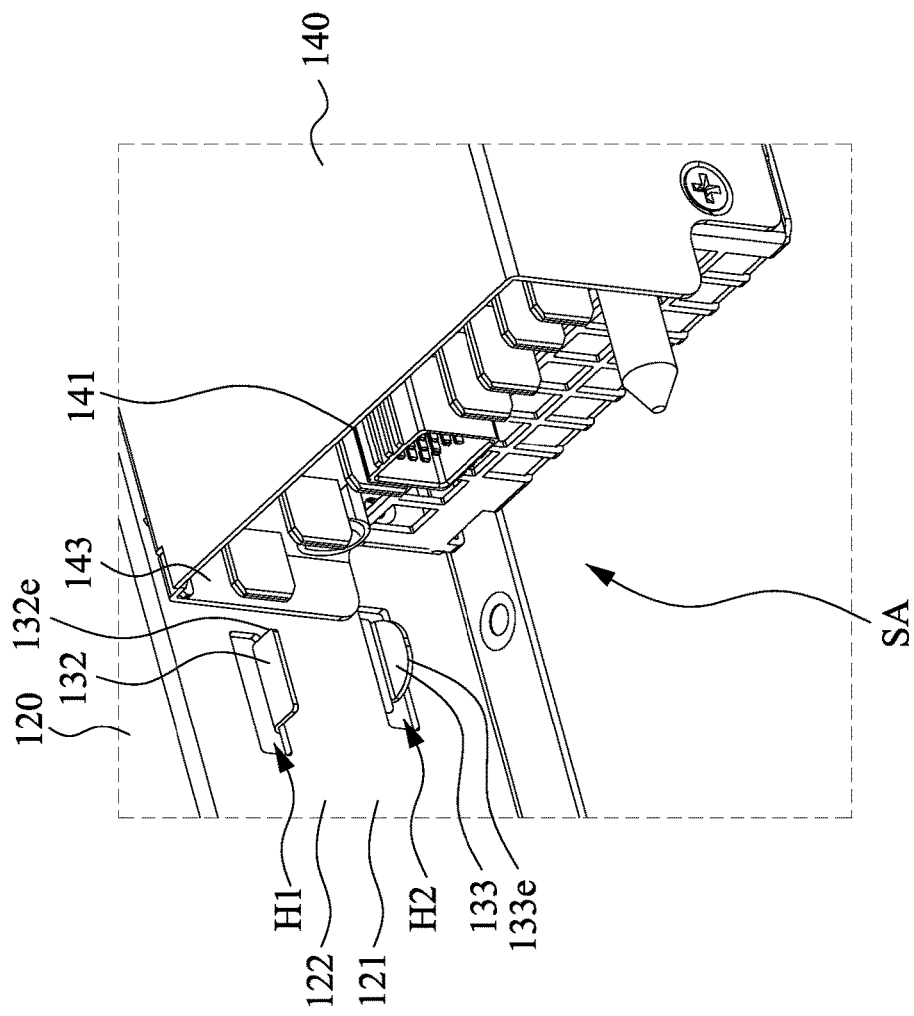
FIG. 9 is a partially enlarged view of the area N of FIG. 8.

Reference is made to FIGS. 8-9. FIG. 8 is a view showing a relative position of the power supplying unit 140 and the power cage 120 of FIG. 2, in which the power supplying unit 140 abuts against the blocking plate 132. FIG. 9 is a partially enlarged view of the area N of FIG. 8. For the simplification of the figures, only the power supplying unit 140 and the power cage 120 are shown in FIGS. 8-9, while other structures of the server device 100 are omitted. In this embodiment, as shown in FIGS. 8-9, the power supplying unit 140 is inserted into the accommodation space SA (please also refer to FIG. 2) in an up-side-down status. The up-side-down status of the power supplying unit 140 is regarded as an incorrect status. Assuming the server device 100 do not include the spring leaf structure 130, after the power supplying unit 140 is inserted into the accommodation space SA, the first end 141 of the power supplying unit 140 will finally contact with the power distributing unit 150. When the power supplying unit 140 is in the status of up-side-down, the shape of the first end 141 of the power supplying unit 140 and the shape of the power distributing unit 150 do not match with each other. Thus, the power supplying unit 140 is not able to electrically connect with the power distributing unit 150. In other words, after the power supplying unit 140 is inserted into the accommodation space SA in the deepest manner, the user can only know that the power supplying unit 140 is in the incorrect status through the foolproof mechanism between the shape of the power supplying unit 140 and the shape of the power distributing unit 150.

However, in this embodiment, when the power supplying unit 140 is inserted into the accommodation space SA in the up-side-down status, the subsidiary plate 145 of the power supplying unit 140 abuts against the blocking plate 132. When the subsidiary plate 145 of the power supplying unit 140 abuts against the straight edge 132e of the blocking plate 132, the blocking plate 132 blocks the power supplying unit 140 from further inserting into the accommodation space SA. In this way, the power supplying unit 140 is not able to continue to be inserted into the accommodation space SA anymore. In other words, under the action of the spring leaf structure 130, the server device 100 provides a foolproof mechanism to prevent the power supplying unit 140 from being inserted into the accommodation space SA in the up-side-down status (i.e., incorrect status). As a result, the power supplying unit 140 and the power distributing unit 150 are effectively prevented from being damaged due to incorrect installation.

In conclusion, when compared with the prior art, the aforementioned embodiments of the present disclosure have at least the following advantages:

(1) When the subsidiary plate of the second plate body abuts against the curved edge of the unlocking plate, the unlocking plate is pressed to leave from the accommodation space, such that the main body of the spring leaf structure elastically deforms and the blocking plate also leaves from the accommodation space. In this way, the blocking plate is no longer protruding to the accommodation space, and the power supplying unit is able to continue to insert into and accommodate in the accommodation space. In other words, the blocking plate guarantees that the power supplying unit is inserted into the accommodation space in a correct direction of installation.

(2) If the power supplying unit is inserted into the accommodation space in the up-side-down status, the subsidiary plate of the power supplying unit abuts against the blocking plate. When the subsidiary plate of the power supplying unit abuts against the straight edge of the blocking plate, the blocking plate blocks the power supplying unit from further inserting into the accommodation space. In this way, the power supplying unit is not able to continue to be inserted into the accommodation space anymore. In other words, under the action of the spring leaf structure, the server device provides a foolproof mechanism to prevent the power supplying unit from being inserted into the accommodation space in the up-side-down status (i.e., incorrect status). As a result, the power supplying unit and the power distributing unit are effectively prevented from being damaged due to incorrect installation.

In one embodiment of the present disclosure, the server device can be applied to, for example, computing by artificial intelligence (AI) or edge computing. Moreover, the server device can also be used as a 5G server, a cloud server or an internet server for vehicles.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A server device, comprising:

a chassis;

a plurality of power cages arranged along a first direction inside the chassis and separated from each other, each of the power cages extending along a second direction, adjacent two of the power cages defining an accommodation space therebetween, at least one of the power cages comprising a first plate body having a first surface and a second surface opposite to each other, the first surface defining the accommodation space, the first plate body having a first through hole and a second through hole, the first through hole and the second through hole arranging along a third direction, the first direction, the second direction and the third direction being perpendicular to each other;

a spring leaf structure comprising a main body, a blocking plate and an unlocking plate, the main body extending along the second direction, an end of the main body connecting with the second surface, the blocking plate and the unlocking plate respectively connecting with another end of the main body and protruding to the accommodation space respectively through the first through hole and the second through hole, the blocking plate comprising a straight edge extending along the first direction, the unlocking plate comprising a curved edge; and at least one power supplying unit comprising a second plate body configured to abut against and slide along the first surface, the second plate body comprising a main plate and a subsidiary plate connecting with each other, the subsidiary plate and the main plate forming a stair structure, the subsidiary plate being configured to abut against the straight edge or the curved edge;

wherein when the subsidiary plate abuts against the straight edge, the blocking plate blocks the power supplying unit from further inserting into the accommodation space, when the subsidiary plate abuts against the curved edge, the unlocking plate is pressed to leave from the accommodation space, such that the main body elastically deforms and the blocking plate also leaves from the accommodation space.

2. The server device of claim 1, wherein the main body is at least partially located between the blocking plate and the unlocking plate.

3. The server device of claim 1, wherein the blocking plate and the unlocking plate are substantially parallel with each other and are substantially perpendicular to the main body.

4. The server device of claim 3, wherein the main plate comprises a first edge and a second edge opposite to each other, the subsidiary plate comprises a third edge and a fourth edge opposite to each other, the first edge and the third edge mutually connect to form a straight line, the second edge and the first edge have a first distance therebetween, the fourth edge and the third edge have a second distance therebetween, the second distance is less than the first distance.

5. The server device of claim 1, further comprising:

a power distributing unit disposed inside the chassis, the power supplying unit being configured to electrically connect with the power distributing unit.

6. The server device of claim 1, wherein a quantity of the power supplying unit is plural, and each of the power supplying units is configured to accommodate in the corresponding accommodation space.

* * * * *